United States Patent
Poulton et al.

(10) Patent No.: US 6,909,310 B2
(45) Date of Patent: Jun. 21, 2005

(54) CMOS CONTROLLED-IMPEDANCE TRANSMISSION LINE DRIVER

(75) Inventors: Kenneth D. Poulton, Palo Alto, CA (US); Robert M. R. Neff, Palo Alto, CA (US); Jorge A. Pernillo, Daly City, CA (US); Mehrdad Heshami, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/354,281

(22) Filed: Jan. 30, 2003

(65) Prior Publication Data

US 2004/0150432 A1 Aug. 5, 2004

(51) Int. Cl.[7] ................................................ H03B 1/00
(52) U.S. Cl. .......................... 327/108; 327/563; 327/65
(58) Field of Search ................................. 327/108, 112, 327/389, 391, 427, 50–52, 63, 65, 562, 563, 538, 541, 543, 109, 111, 170; 330/261, 277, 253, 296; 326/33, 34, 27, 83, 30

(56) References Cited

U.S. PATENT DOCUMENTS

| | | | | |
|---|---|---|---|---|
| 4,563,654 A | * | 1/1986 | Arai et al. | 330/277 |
| 4,622,521 A | * | 11/1986 | Redfern | 330/253 |
| 5,442,309 A | * | 8/1995 | Cabler | 327/108 |
| 5,821,809 A | * | 10/1998 | Boerstler et al. | 327/563 |
| 6,570,436 B1 | * | 5/2003 | Kronmueller et al. | 327/538 |

* cited by examiner

Primary Examiner—Long Nguyen (57) ABSTRACT

A line driver fabricated from CMOS devices that provides a substantially constant output impedance over a significant range of a time-varying input voltage includes a time-varying current source, a pair of CMOS output loads, and a pair of biasing circuits. Each CMOS output load includes a NMOS transistor and a PMOS transistor connected in parallel and each biased into a linear range of operation. In response to a time-varying input voltage, the time-varying current source draws current from the pair of CMOS output loads in a manner that operates each CMOS output load to collectively establish a time-varying output voltage component at an associated output terminal.

20 Claims, 8 Drawing Sheets

CMOS CONTROLLED-IMPEDANCE TRANSMISSION LINE DRIVER

FIELD OF THE INVENTION

The present invention generally relates to the field of complementary metal-oxide semiconductor ("CMOS") integrated circuits. More specifically, the present invention relates to the CMOS output pad driver for high-speed signals with an output impedance matched to a transmission-line impedance.

DESCRIPTION OF THE RELATED ART

When driving controlled-impedance transmission lines, it is important that at least one end of the line be terminated with a resistance as close as practical to the characteristic impedance of the transmission line in order to prevent reflections from the end of the line from corrupting the signal. This termination can be at the driving (source) end, the receiving end, or at both ends.

Figure 1:
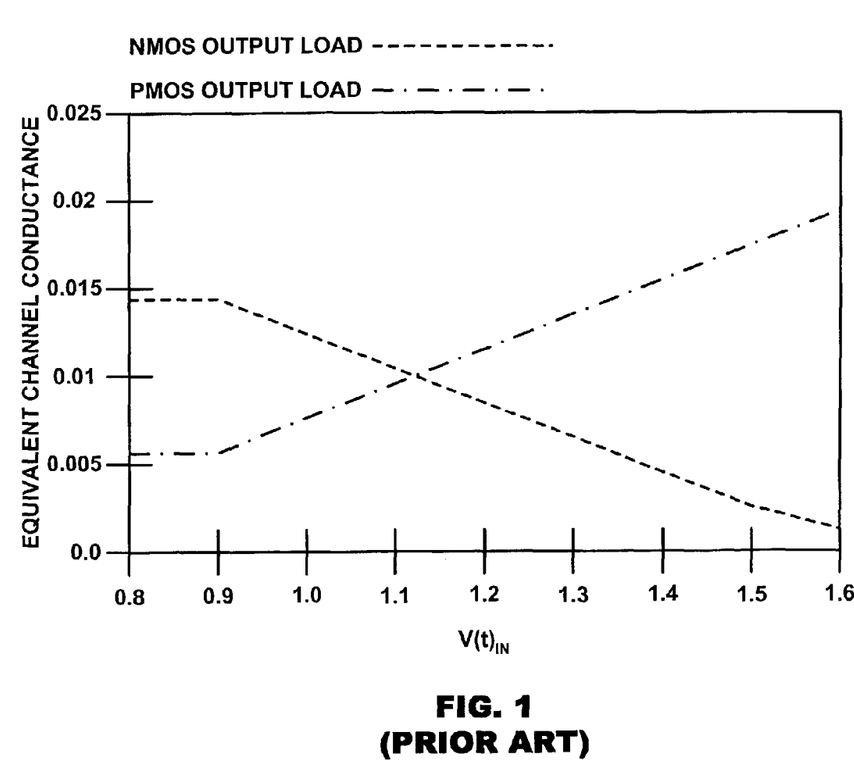
FIG. 1 exemplarily illustrates the known relationship between the equivalent channel conductance of an NMOS output load and a time-varying input voltage, and the known relationship between the equivalent channel conductance of a PMOS output load and a time-varying input voltage.

FIG. 1 exemplarily illustrates a known relationship of an equivalent channel conductance and the time-varying input voltage $V(t)_{IN}$ as associated with a n-channel MOS ("NMOS") output load and a p-channel MOS ("PMOS") output load. To drive a transmission line of impedance $Z_0$ (e.g., 50 ohms), the equivalent channel conductance of the NMOS output load and the PMOS output load over a substantial range of the time-varying input voltage $V(t)_{IN}$ should operatively approximate a constant equal to $1/Z_0$ (e.g., 20 mS). However, as illustrated in FIG. 1 for the NMOS output load and the PMOS output load, the equivalent channel conductance of either device type varies by large amounts over a substantial range of the time-varying input voltage $V(t)_{IN}$. Consequently, NMOS output loads and PMOS output loads by themselves are not suited as terminations for transmission lines.

SUMMARY OF THE INVENTION

The present invention provides a line driver implemented in CMOS devices suitable for driving various types of lines, such as, for example, transmission lines with a constant output impedance.

A single-ended line driver comprising a current source, the CMOS output load and an output terminal is constructed in accordance with a first embodiment of the present invention. The current source is controllable by the time-varying input voltage. The CMOS output load generates the time-varying output voltage at the output terminal in response to the current source being controlled by the time-varying input voltage. The CMOS output load includes a NMOS transistor and a PMOS transistor connected in parallel and each biased into a linear range of operation. An operational implementation of this single-ended line driver is best suited for a single-ended receiving circuit at the other end of a transmission line that is connected to the CMOS output load.

A differential line driver comprising a current source, a pair of CMOS output loads, and a pair of output terminals is constructed in accordance with a second embodiment of the present invention. The current source is controllable by the time-varying input voltage. Each CMOS output load generates the time-varying output voltage at an associated output terminal in response to the current source being controlled by the time-varying input voltage. Each CMOS output load includes a NMOS transistor and a PMOS transistor connected in parallel and each biased into a linear range of operation. An operational implementation of this differential line driver is best suited for a differential receiving circuit at the other end of a pair of transmission lines, each line being connected to one of the CMOS output loads.

The foregoing forms as well as other forms, features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

DETAILED DESCRIPTION OF THE EMBODIMENTS

Figure 2:
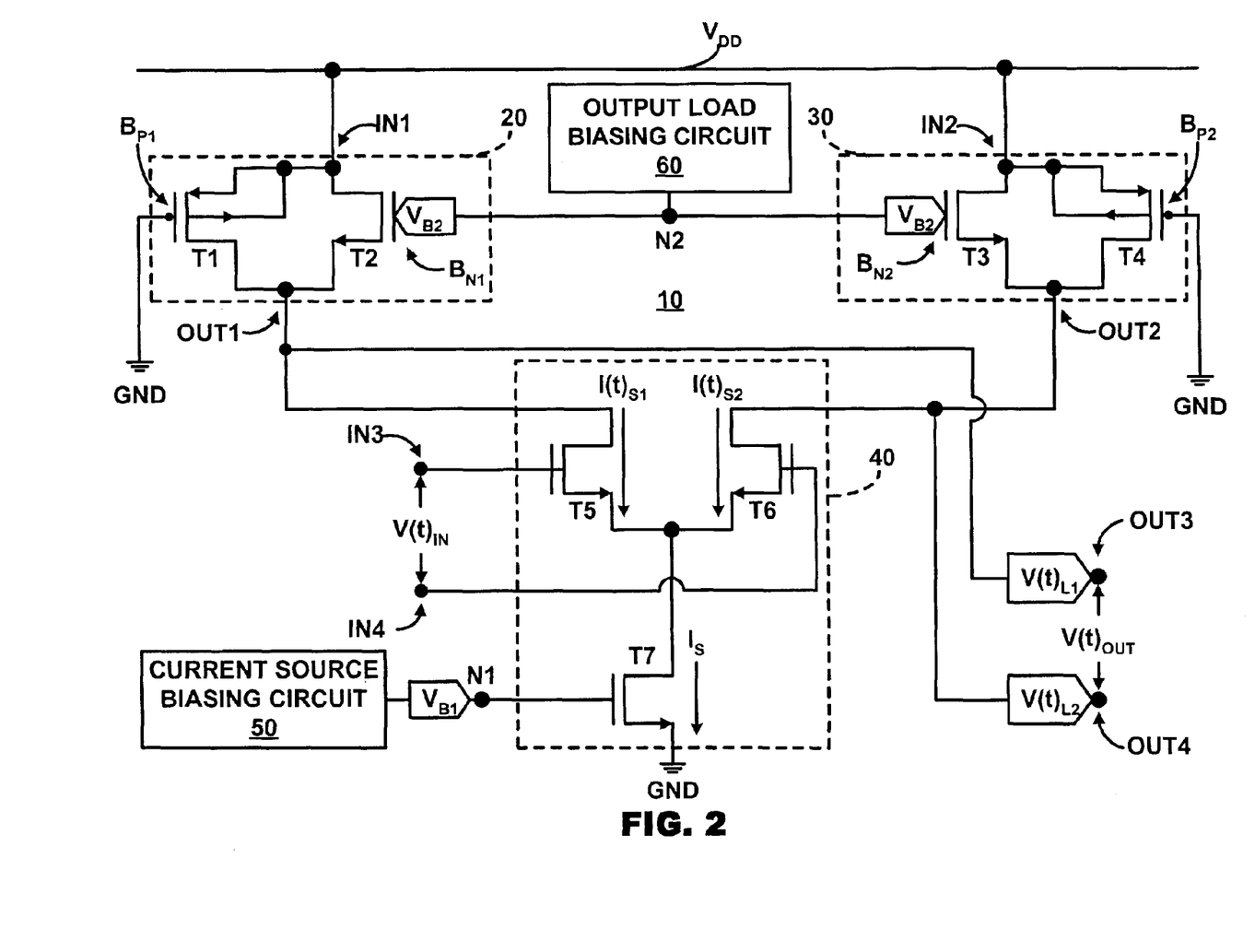
FIG. 2 illustrates a first embodiment of a line driver in accordance with the present invention.

FIG. 2 illustrates an example of a first embodiment 10 of a line driver of the present invention. The line driver 10 comprises the CMOS output load 20, the CMOS output load 30, and the time-varying current source 40.

The CMOS output load 20 is a four-terminal device in which the load input terminal IN1 is connected to the supply voltage $V_{DD}$, and the load output terminal OUT1 is connected to the time-varying current source 40 and the driver output terminal OUT3. The PMOS transistor T1 and the NMOS transistor T2 are connected in parallel between the load input terminal IN1 and the load output terminal OUT1. Specifically, the source and drain terminals of PMOS transistor T1 are connected to the drain and source terminals, respectively, of NMOS transistor T2 and to load input terminal IN1 and load output terminal OUT1, respectively. The gate terminal of the PMOS transistor T1 and the gate terminal of NMOS transistor T2 serve as the bias terminals $B_{P1}$ and $B_{N1}$, respectively, of the CMOS output load 20. The bias terminal $B_{P1}$ of CMOS output load 20 is connected to the ground GND to bias the PMOS transistor T1 into a linear range of operation. The bias terminal $B_{N1}$ of CMOS output load 20 is connected to the node N2 to receive the biasing voltage $V_{B2}$ from the output load biasing circuit 60. The biasing voltage $V_{B2}$ biases the NMOS transistor T2 into a linear range of operation.

The CMOS output load 30 is a four-terminal device in which the load input terminal IN2 is connected to the supply voltage $V_{DD}$, and the load output terminal OUT2 is connected to the time-varying current source 40 and the driver output terminal OUT4. The NMOS transistor T3 and the PMOS transistor T4 are connected in parallel between the load input terminal IN2 and the load output terminal OUT2. Specifically, the source and drain terminals of PMOS transistor T4 are connected to the drain and source terminals, respectively, of NMOS transistor T3 and to load input terminal IN2 and load output terminal OUT2, respectively. The gate terminal of the NMOS transistor T3 and the gate terminal of the PMOS transistor T4 serve as the bias terminals $B_{N2}$ and $B_{P2}$, respectively, of the CMOS output load 30. The bias terminal $B_{N2}$ of CMOS output load 30 is connected to the node N2 to receive the biasing voltage $V_{B2}$ from the output load biasing circuit 60. The biasing voltage $V_{B2}$ biases the NMOS transistor T3 into a linear range of operation. The bias terminal $B_{P2}$ of CMOS output load 30 is connected to the ground GND to bias the PMOS transistor T4 into a linear range of operation.

The time-varying current source 40 has a known arrangement of the NMOS transistor T5, the NMOS transistor T6, and the NMOS transistor T7. The gate terminals of transistors T5 and T6 are connected to the driver input terminal IN3 and the driver input terminal IN4, respectively, to receive the time-varying input voltage $V(t)_{IN}$. The gate terminal of NMOS transistor T7 is connected to the node N1 to receive the biasing voltage $V_{B1}$. The source terminals of NMOS transistors T5 and T6 are connected to one another and to the drain terminal of NMOS transistor T7. The drain terminals of NMOS transistors T5 and T6 are connected to the load output terminal OUT1 of CMOS output load 20 and to the load output terminal OUT2 of CMOS output load 30, respectively.

To ensure that the output impedance and voltage swing of the line driver 10 are insensitive to process and temperature variations of line driver 10 as well as power supply variations, the line driver 10 further comprises the current source biasing circuit 50 and the output load biasing circuit 60 for providing the biasing voltage $V_{B1}$ and the biasing voltage $V_{B2}$ respectively, which vary with temperature, supply voltage, and process.

An exemplary embodiment of the current source biasing circuit 50 will now be described with reference to FIGS. 2 and 3. The current source biasing circuit 50 generates the process-dependent, temperature-dependent and power supply-dependent biasing voltage $V_{B1}$ that biases the NMOS transistor T7 in a manner that causes transistor T7 to sink a constant source current $I_s$. The current source biasing circuit 50 includes the amplifier U1, the resistor R1, the NMOS transistor T8, and the NMDS transistor T9. The inverting input of the amplifier U1 receives a reference voltage $V_{REF}$. One end of the resistor R1 is connected to the supply voltage $V_{DD}$. The other end of the resistor R1 is connected to the drain terminal of the NMOS transistor T8 and the non-inverting input of the amplifier U1. The gate terminal of the NMOS transistor T8 is connected to the supply voltage $V_{DD}$. The source terminal of the NMOS transistor T8 is connected to the drain terminal of the NMOS transistor T9. The source terminal of the NMOS transistor T9 is connected to the GND. The output of the amplifier U1 is connected to the gate terminal of the NMOS transistor T9 and the node N1 whereby the amplifier U1 provides biasing voltage $V_{B1}$, to the gate terminal of the NMOS transistor T9 and the node N1.

In one embodiment of the current source biasing circuit 50, the NMOS transistor T8 and the NMOS transistor T9 are replicas of the NMOS transistor T5 and the NMOS transistor T7 Illustrated in FIG. 2, the resistor R1 is located off the chip in which the current source biasing circuit 50 is fabricated, and the reference voltage $V_{REF}$ is derived from an off-chip reference. A transistor that is a "replica" of a "reference" transistor has the same characteristics as the reference transistor, but has 1/n of the area and operates at 1/n of the operating current of the reference transistor. Using a replica transistor reduces the chip area required and reduces current consumption compared with using a transistor equal in area to, and operating at the same current as, the reference transistor.

In one alternative embodiment of source current biasing circuit 50, the NMOS transistor T8 is omitted, and the drain terminal of NMOS transistor T9 is connected to the resistor R1 and the non-inverting input of the amplifier U1.

An exemplary embodiment of the output load biasing circuit 60 will now be described with reference to FIGS. 2 and 4. The output load biasing circuit 60 generates the biasing voltage $V_{B2}$. Biasing voltage $V_{B2}$ is a voltage greater than the supply voltage $V_{DD}$ by a voltage independent of process to insure the linear operation of the NMOS transistor T2 and the NMOS transistor T3.

The NMOS transistor T2 and the NMOS transistor T3 serve as devices with adjustable conductance in line driver 10. Conductance is the reciprocal of resistance. Each of the CMOS loads 20 and 30 has a conductance that is the sum of the conductances of the parallel-connected PMOS and PMOS transistors T1, T2 and T4, T3. Changing the biasing voltage $V_{B2}$ changes the drain-to-source conductance of the NMOS transistors T2 and T3, thereby changing the conductance of the respective CMOS load. The output load biasing circuit 60 sets the biasing voltage $V_{B2}$ to make the conductance of the CMOS loads 20 and 30 match the conductance of the resistor R2, which is 20 mS or 1/50 ohm in the examples described herein.

The output load biasing circuit 60 includes the resistor R2, the amplifier U2, the NMOS transistor T10, the NMOS transistor T11, the NMOS transistor T12, the NMOS transistor T13, and the CMOS output load 70. The gate terminals of the NMOS transistor T10 and the NMOS transistor T11 are connected to the node N1 from which the NMOS transistor T10 and the NMOS transistor T11 receive the biasing voltage $V_{B1}$. The source terminals of the NMOS transistor T10 and the NMOS transistor T11 are connected to ground GND. The drain terminals of the NMOS transistor T10 and the NMOS transistor T11 are connected to the source terminals of the NMOS transistor T12 and the NMOS transistor T13, respectively. The gate terminals of the NMOS transistor T12 and the NMOS transistor T13 are connected to the supply voltage $V_{DD}$. The drain terminal of transistor T13 is connected to both the non-inverting input of the amplifier U2 and one end of the resistor R2. The other end of resistor R2 is connected to the supply voltage $V_{DD}$.

The CMOS output load 70 is a four terminal device in which the load input terminal IN5 is connected to the supply voltage $V_{DD}$, and the load output terminal OUT5 is connected to the drain terminal of the NMOS transistor T12 and the inverting input of the amplifier U2. The PMOS transistor T14 and the NMOS transistor T15 are connected in parallel between the load input terminal IN5 and the load output terminal OUT5. Specifically, the source and drain terminals of the PMOS transistor T14 are connected to the drain and source terminals, respectively, of the NMOS transistor T15 and to the load input terminal IN5 and the load output terminal OUT5, respectively. The gate terminal of the PMOS transistor T14 and the gate terminal of the NMOS transistor T15 serve as the bias terminals $B_{P3}$ and $B_{N3}$, respectively, of the CMOS output load 70. The bias terminal $B_{P3}$ of the CMOS output load 70 is connected to ground GND to bias the PMOS transistor T14 into a linear range of operation. The bias terminal $B_{N3}$ of the CMOS output load 70 is connected to the output terminal of the amplifier U2 to receive the biasing voltage $V_{B2}$. The biasing voltage $V_{B2}$ biases the NMOS transistor T15 into a linear range of operation. The output terminal of the amplifier U2 is further connected to the node N2 to supply the biasing voltage $V_{B2}$ to the bias terminals $B_{N1}$ and $B_{N2}$ of the CMOS output loads 20 and 30, respectively.

In one embodiment of the output load biasing circuit 60, the CMOS output load 70 is a replica of the CMOS output loads 20 and 30 illustrated in FIG. 2, and the resistor R2 is located off the chip in which the output load biasing circuit 60 is fabricated.

In one alternative embodiment of the output load biasing circuit 60, the NMOS transistor T12 and the NMOS transistor T13 are omitted, the drain terminal of NMOS transistor 10 is connected to the output terminal OUT5 of the CMOS output 70 and the inverting input of amplifier U2, and the drain terminal of NMOS transistor T11 is connected to the resistor R2 and the non-inverting input of the amplifier U2.

An exemplary operation of the line driver 10 will now be described with reference to FIGS. 2–4. In this example, the supply voltage $V_{DD}$ is one volt to two volts lower than the upper supply rail (not shown) of the amplifier U2, the reference voltage $V_{REF}$ is 800 mV less than the supply voltage $V_{DD}$, and the resistor R1 and the resistor R2 are 50 ohms. The reference voltage $V_{REF}$ is used by the amplifier U1 to establish the biasing voltage $V_{B3}$ that sets the biasing current $I_{B1}$ flowing through the NMOS transistor T9 nominally equal to $(V_{DD}-V_{REF})/R1$. Consequently, the biasing voltage $V_{B1}$ primarily depends upon the supply voltage $V_{DD}$, the reference voltage $V_{REF}$, and the resistor R1, which are all unaffected by process variations.

The biasing voltage $V_{B1}$ sets the gate voltages of the NMOS transistor T7, the NMOS transistor T10, and the NMOS transistor T11. The biasing voltage $V_{B1}$ biases NMOS transistor T7 into saturation to sink the constant source current $I_S$. The biasing voltage $V_{B1}$ biases NMOS transistor T11 into saturation to sink the biasing current $I_{B2}$ through NMOS transistor T13 and the resistor R2, where the biasing current $I_{B2}$ is nominally equal to the source current $I_S$. The biasing voltage $V_{B1}$ biases NMOS transistor T10 into saturation to sink the biasing current $I_{B3}$ through the NMOS transistor T12 and the CMOS output load 70, where the biasing current $I_{B3}$ is nominally equal to the biasing current $I_{B2}$. The amplifier U2 sets the biasing voltage $V_{B2}$ to operate the CMOS output load 70 at a resistance such that the biasing voltage $V_{B4}$ resulting from bias current $I_{B3}$ flowing through the CMOS output load is nominally equal to the biasing voltage $V_{B5}$ resulting from the biasing current $I_{B2}$ flowing through the resistor R2. In an example in which R2=50 ohms, the biasing voltage $V_{B2}$ sets the impedance of CMOS output load 70 to 50 ohms.

The biasing current is $I_{B1}$, the biasing current $I_{B2}$, and the biasing current $I_{B3}$ and the output driver current $I_S$ may be equal. Alternatively, in an embodiment in which the current source biasing circuit 50 and the output load biasing circuit 60 are constructed with replica transistors, the biasing current $I_{B1}$, the biasing current $I_{B2}$, and the biasing current $I_{B3}$ are each related the source current is by a non-unity scale factor to reduce power consumption and chip area.

The biasing voltage $V_{B2}$ should be greater than the supply voltage $V_{DD}$. This requires that the amplifier U2 be able to drive the biasing voltage $V_{B2}$ to a voltage of $V_{DD}+V_{tN}$ or greater, which requires that the amplifier U2 be powered by an upper supply rail (not shown) at least as high as the biasing voltage $V_{B2}$. This will typically require that the NMOS transistor T2, the NMOS transistor T3, and the NMOS transistor T15 have larger breakdown voltages than the main supply voltage $V_{DD}$. Voltage $V_{tN}$ is the threshold voltage of the NMOS transistors.

Figure 3:
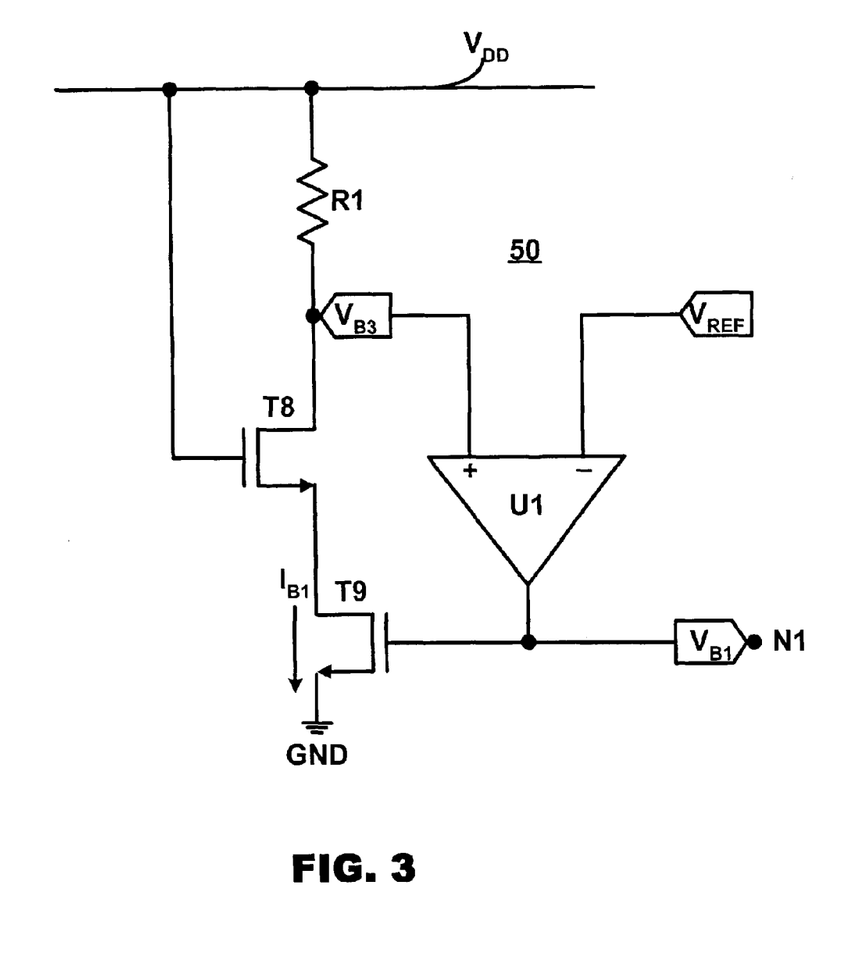
FIG. 3 illustrates one embodiment of a current source biasing circuit in accordance with the present invention.
Figure 4:
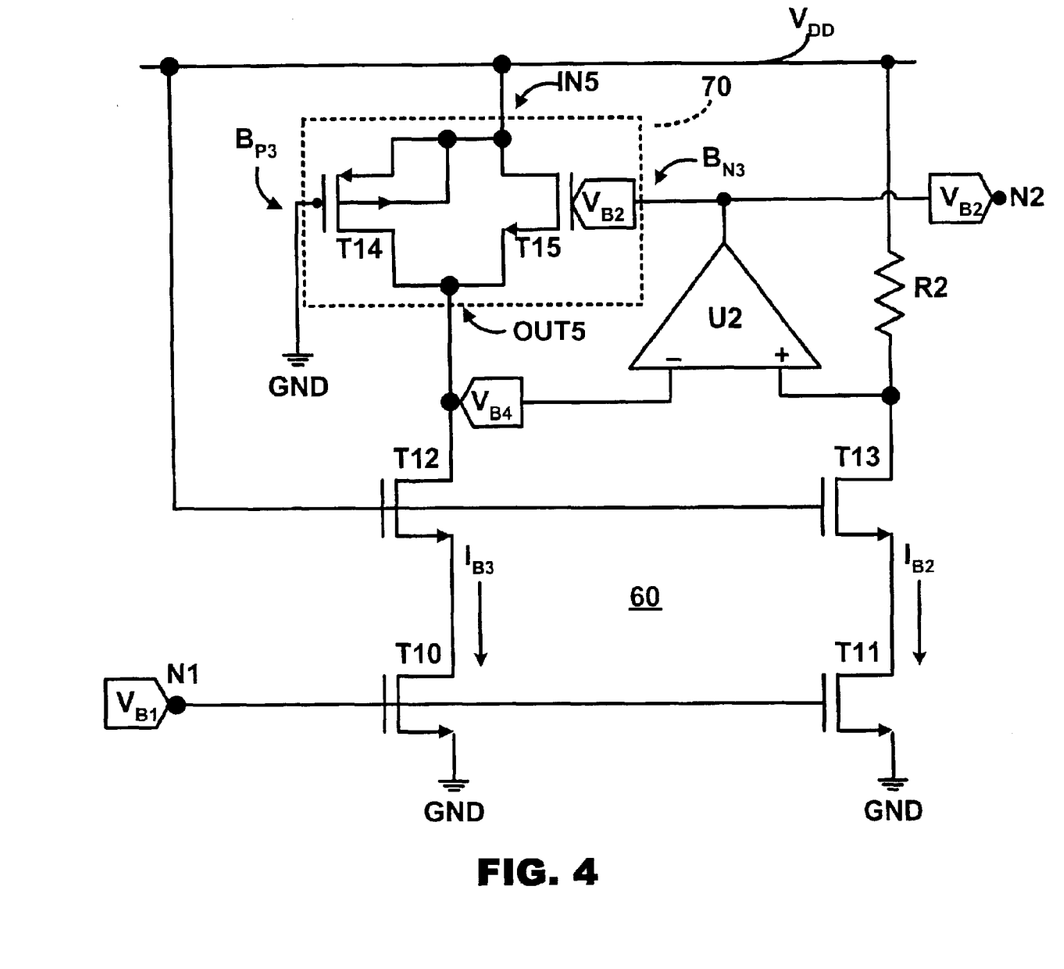
FIG. 4 illustrates a first embodiment of an output load biasing circuit in accordance with the present invention.
Figure 5A:
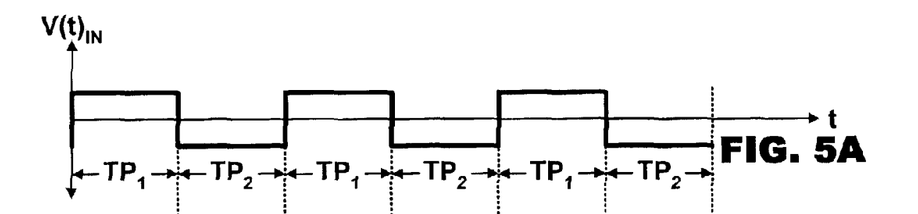
FIGS. 5A–5F illustrate various voltages and currents associated with an operation of the line driver illustrated in FIG. 2.
Figure 5B:
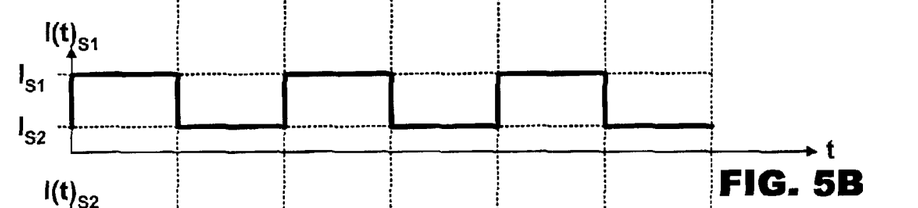

Still referring to FIGS. 2–4, in operation, the time-varying current source 40 is controlled by the time-varying input voltage $V(t)_{IN}$ illustrated in FIG. 5A. In response thereto, the time-varying current source 40 draws a time-varying source current component $I(t)_{S1}$ from the CMOS output load 20, and draws a time-varying source current component $I(t)_{S2}$ from the CMOS output load 30. During the time period TP1 of each cycle of the time-varying input voltage $V(t)_{IN}$ illustrated in FIG. 5A, the time-varying source current component $I(t)_{S1}$ equals the source current level $I_{S1}$ illustrated in FIG. 5B, and the time-varying source current component $I(t)_{S2}$ equals the source current level $I_{S2}$ illustrated in FIG. 5C. Conversely, during the time period TP2 of each cycle of the time-varying input voltage $V(t)_{IN}$ illustrated in FIG. 5A, the time-varying source current component $I(t)_{S1}$ equals the source current level $I_{S2}$ illustrated in FIG. 5B, and the time-varying source current component $I(t)_{S2}$ equals the source current level $I_{S1}$ illustrated in FIG. 5C.

The time-varying current source 40 therefore continuously draws current equal to source current $I_S$ from the CMOS output load 20 and the CMOS output load 30, collectively. The source current $I_S$ equals the sum of the source current level $I_{S1}$ and the source current level $I_{S2}$, where $I_{S1}>I_{S2}$ 0. The biasing voltage $V_{B3}$ set by the amplifier U1 determines the voltage drop across the resistor R1, which sets the output driver current $I_S$ nominally equal to the biasing current $I_{B1}$. The current source biasing circuit 50 therefore controls the time-varying source current component $I(t)_{S1}$ flowing through the CMOS output load 20 and the time-varying source current component $I(t)_{S2}$ flowing through the CMOS output load 30.

The time-varying current source 40 drawing the time-varying source current component $I(t)_{S2}$ from the CMOS output load 20 causes a voltage drop across the parallel connection of the PMOS transistor T1 and the NMOS transistor T2. This generates a time-varying output voltage component $V(t)_{L1}$ at the output terminal OUT3. During the time period TP1 of each cycle of the time-varying input voltage $V(t)_{IN}$ illustrated in FIG. 5A, the time-varying output voltage component $V(t)_{L1}$ equals an output voltage level $V_{L1}$ illustrated in FIG. 5D. During the time period TP2 of each cycle of the time-varying input voltage $V(t)_{IN}$ illustrated in FIG. 5A, the time-varying output voltage component $V(t)_{L1}$ equals an output voltage level $V_{L2}$ illustrated in FIG. 5D, where $V_{DD}$ $V_{L1}>V_{L2}$ $V_{B5}$.

When all the source current $I_S$ is drawn from the CMOS load 20, $V_{L1}=V_{B5}$ and $V_{L2}=V_{DD}$. Since the voltage drop $(V_{DD}-V_{B5})$ across the CMOS load 20 is nominally equal to the voltage drop across the resistor R2 and the current $I_S$ through the CMOS load 20 is nominally equal to the current through the resistor R2, the effective output impedance of the CMOS load 20 is equal to the resistance of the resistor R2 (i.e., the output impedance of CMOS output load 20 is insensitive to any temperature and process variations of line driver 10 as well as any power supply variations). As a result, the CMOS output load 20 operates as a 50 ohm equivalent impedance corresponding to the resistor R2.

Similarly, the time-varying current source 40 drawing the time-varying source current component $I(t)_{S2}$ from the CMOS output load 30 causes a voltage drop across the parallel connection of the NMOS transistor T3 and the PMOS transistor T4. This generates a time-varying output voltage component $V(t)_{L2}$ at the output terminal OUT4. During the time period TP1 of each cycle of the time-varying input voltage $V(t)_{IN}$ illustrated in FIG. 5A, the time-varying output voltage component $V(t)_{L2}$ equals the output voltage level $V_{L2}$ illustrated in FIG. 5E. During the time period TP2 of each cycle of the time-varying input voltage $V(t)_{IN}$ illustrated in FIG. 5A, the time-varying output voltage component $V(t)_{L2}$ equals the output voltage level $V_{L1}$ illustrated in FIG. 5E. Again, $V_{DD} V_{L1} > V_{L2} V_{B5}$. As a result, the CMOS output load 30 is operated as a 50 ohm equivalent impedance corresponding to the resistor R2.

When all the source current $I_S$ is drawn from the CMOS load 30, $V_{L1}=V_{DD}$ and $V_{L2}=V_{B5}$. Since the voltage drop $(V_{DD}-V_{B5})$ across the CMOS load 30 is nominally equal to the voltage drop across the resistor R2 and the current $I_S$ through the CMOS load 30 is nominally equal to the current through the resistor R2, the effective output impedance of the CMOS load 30 is equal to the resistance of the resistor R2 (i.e., the output impedance of CMOS output load 30 is insensitive to any temperature and process variations of line driver 10 as well as any power supply variations). As a result, the CMOS output load 30 operates a 50 ohm equivalent impedance corresponding to the resistor R2.

Figures 5C, 5D, 5E, 5F:
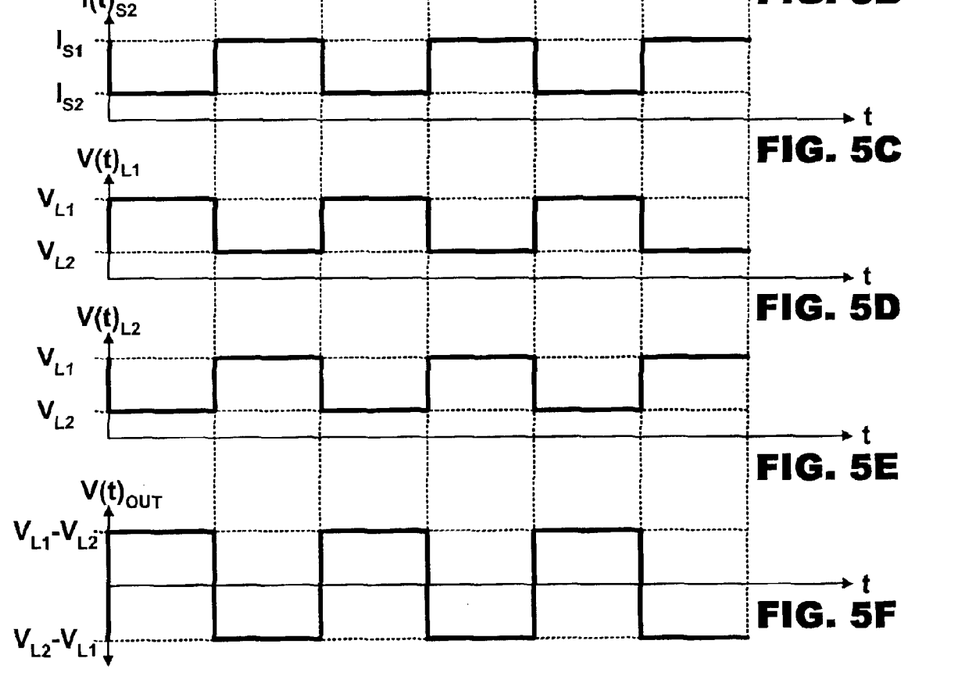
Figure 6:
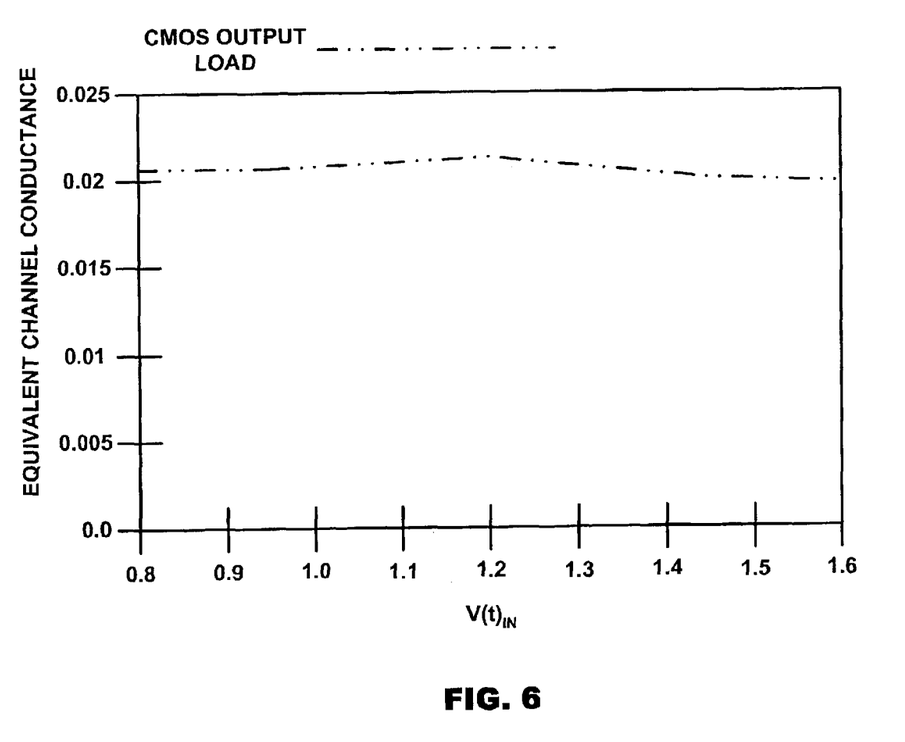
FIG. 6 exemplarily illustrates relationship between the conductance of the CMOS output loads illustrated in FIG. 2 and a time-varying input voltage.

FIG. 6 illustrates an example of the relationship between the conductance of the CMOS output load 20 and the CMOS output load 30 and the time-varying input voltage $V(t)_{IN}$. To drive transmission lines having an impedance $Z_0$ (e.g., 50 ohms), the conductance of the CMOS output load 20 and the CMOS output load 30 should operatively approximate a constant equal to $1/Z_0$ (e.g., 20 mS) over a substantial range of the time-varying input voltage $V(t)_{IN}$. As illustrated in FIG. 6, the conductance of the CMOS output load 20 and the CMOS output load 30 provides a substantially linear approximation of constant $1/Z_0$ due to the output impedances of the CMOS output load 20 and the CMOS output load 30 being set by the output load biasing circuit 60 to be nominally equal to the resistance of resistor R2. Consequently, the CMOS output load 20 and the CMOS output load 30 have the ideal impedance characteristic to drive a receiver circuit (not shown) connected to the output terminal OUT3 and the output terminal OUT4 via transmission lines (not shown). The receiver circuit will receive a time-varying output voltage $V(t)_{OUT}$ that is differentially generated between the output terminal OUT3 and the output terminal OUT4. The time-varying output voltage $V(t)_{OUT}$ illustrated in FIG. 5F is the difference between the time-varying output voltage component $V(t)_{L1}$ and the time-varying output voltage component $V(t)_{L2}$.

In an embodiment in which a receiver circuit (not shown) is coupled only to output terminal OUT3 via a single transmission line (not shown), the receiver circuit will only receive the time-varying output voltage component $V(t)_{L1}$. Similarly, in an embodiment in which the receiver circuit is coupled only to output terminal OUT4 via a single transmission line, the receiver circuit will only receive the time-varying output voltage component $V(t)_{L2}$.

Figure 7:
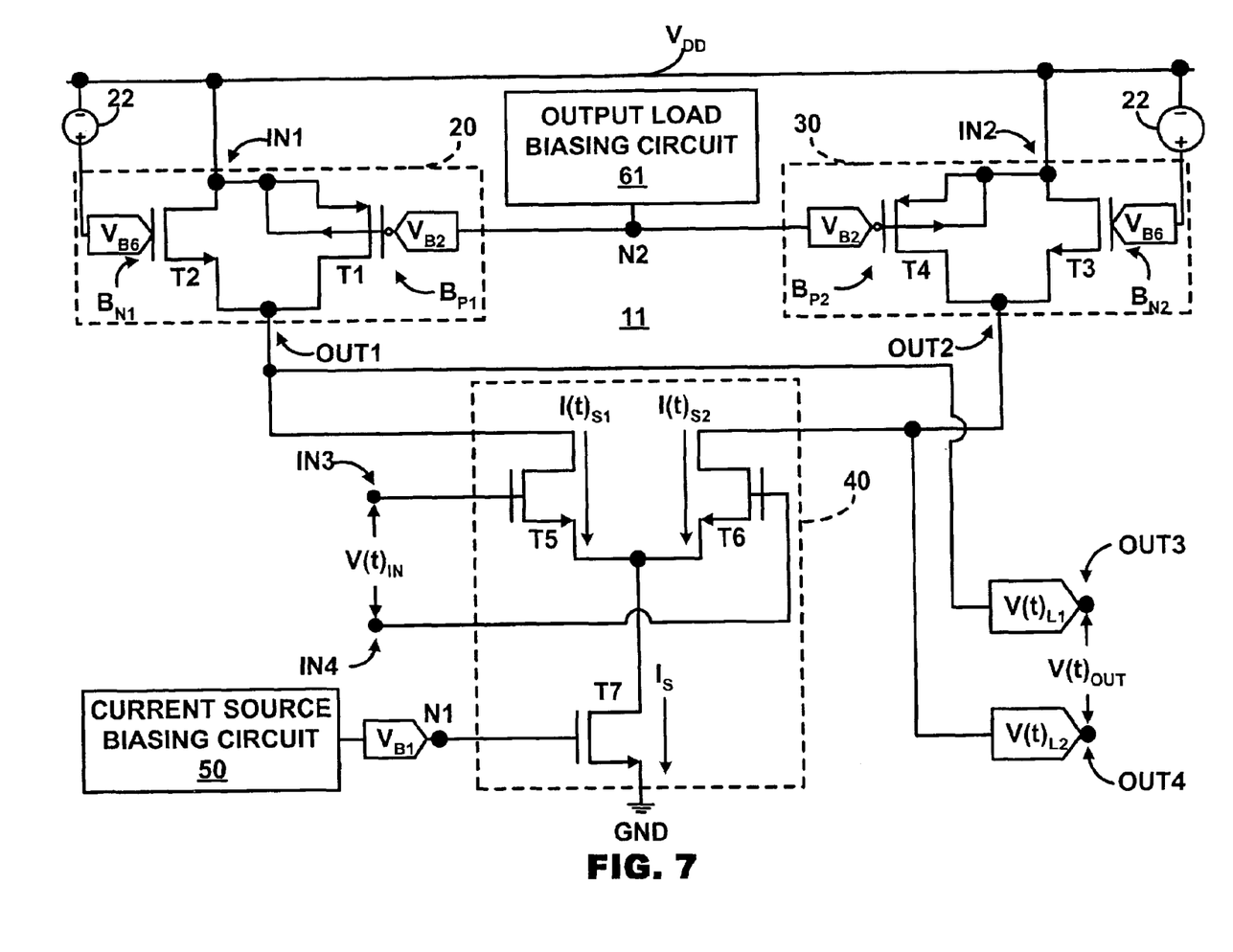
FIG. 7 illustrates a second embodiment of a line driver in accordance with the present invention.

FIG. 7 illustrates an example of a second embodiment 11 of a line driver of the present invention. The line driver 11 comprises the CMOS output load 20, the CMOS output load 30, the time-varying current source 40, the current source biasing circuit 50, and the output load biasing circuit 61. Elements of the line driver 11 that correspond to elements of the line driver 10 described above with reference to FIG. 2 are indicated using the same reference numerals and will not be described again in detail. The line driver 11 operates in a manner similar to that described above with reference to the line driver 10.

In the line driver 11, the bias terminal $B_{P1}$ of the CMOS load 20 and the bias terminal $B_{P2}$ of the CMOS load 30 are connected to the node N2 to receive the biasing voltage $V_{B2}$ from the output load biasing circuit 61. The biasing voltage $V_{B2}$ biases the PMOS transistors T1 and T4 into a linear range of operation. The bias terminal $B_{N1}$ of the CMOS load 20 and the bias terminal $B_{N2}$ of the CMOS load 30 are connected to the voltage source 22 of the biasing voltage $V_{B6}$. The biasing voltage $V_{B6}$ is sufficiently greater than the supply voltage $V_{DD}$ to bias the NMOS transistors T2 and T3 into a linear range of operation.

Figure 8:
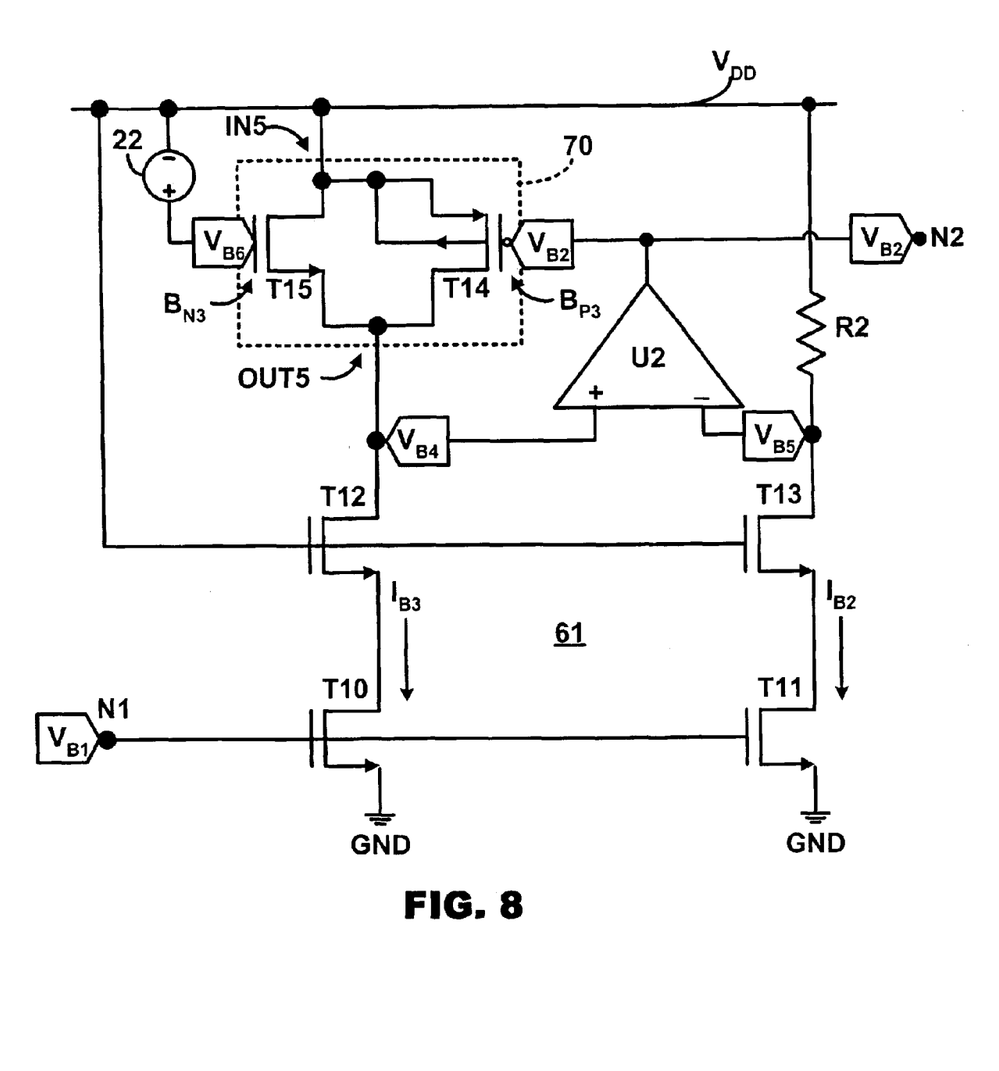
FIG. 8 illustrates a second embodiment of an output load biasing circuit in accordance with the present invention.

An exemplary embodiment of the output load biasing circuit 61 will now be described with reference to FIG. 8. Elements of the output load biasing circuit 61 that correspond to elements of the output load biasing circuit 60 described above with reference to FIG. 4 are indicated using the same reference numerals and will not be described again in detail. In output load biasing circuit 61, the drain terminal of transistor T13 is connected to both the inverting input of the amplifier U2 and one end of the resistor R2. The bias terminal $B_{P3}$ of the CMOS load 70 is connected to the output terminal of the amplifier U2 to receive the biasing voltage $V_{B2}$. The biasing voltage $V_{B2}$ biases the PMOS transistor T14 into a linear range of operation. The bias terminal $B_{N3}$ of the CMOS load 70 is connected to receive an off-chip bias voltage $V_{B6}$ that is greater than $V_{DD}+V_{tN}$. The bias voltage $V_{B6}$ biases the NMOS transistor T15 into a linear range of operation. The load output terminal OUT5 of the CMOS output load 70 is connected to the drain terminal of the NMOS transistor T12 and the non-inverting input of the amplifier U2.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A line driver, comprising:
    a time-varying current source controllable by a time-varying input voltage;
    a output terminal connected to a transmission line;
    a first CMOS output load including a first transistor and a second transistor connected in parallel between a supply voltage and the output terminal, wherein the first transistor and the second transistor are biased for generating a first time-varying output voltage at the output terminal in response to the time-varying current source; and
    an output load biasing circuit coupled to the supply voltage and the first transistor for biasing the first transistor in response to a first biasing voltage provided by the output load biasing circuit based on a transmission impedance of the transmission line.

2. The line driver of claim 1, wherein the first transistor is a NMOS transistor and the second transistor is a PMOS transistor.

3. The line driver of claim 1, wherein the first transistor is a PMOS transistor and the second transistor is a NMOS transistor.

4. The line driver of claim 1, wherein the output load biasing circuit includes a resistor having a resistance equivalent to the transmission impedance of the transmission line.

5. The line driver of claim 4, wherein the output load biasing circuit includes means for generating the first biasing voltage as a function of the resistance of the resistor.

6. The line driver of claim 4, further comprising:
a current source biasing circuit coupled to the supply voltage and the time-varying current source for biasing the time-varying current source in response to a second biasing voltage provided by the current source biasing circuit based on a reference voltage.

7. The line driver of claim 6, wherein the output load biasing circuit includes means for generating the first biasing voltage as a function of the resistance of the resistor and the second biasing voltage.

8. The line driver of claim 1, further comprising:
a current source biasing circuit coupled to the supply voltage and the time-varying current source for biasing the time-varying current source in response to a second biasing voltage provided by the current source biasing circuit based on a reference voltage.

9. The line driver of claim 1, wherein the output load biasing circuit includes a second CMOS output load as a replica of the first CMOS output load.

10. The line driver of claim 1, wherein an output load impedance of the first CMOS load is substantially insensitive to at least one of temperature variations of said line driver, process variations of said line driver, and power supply variations.

11. A line driver, comprising:
a time-varying current source controllable by a time-varying input voltage;
a first output terminal connected to a first transmission line;
a first CMOS output load including a first transistor and a second transistor connected in parallel between a supply voltage and the first output terminal, wherein the first transistor and the second transistor are biased for generating a first time-varying output voltage at the first output terminal in response to the time-varying current source; a second output terminal connected to a second transmission line;
a second CMOS output load including a third transistor and a fourth transistor connected in parallel between the supply voltage and the second output terminal, wherein the third transistor and the fourth transistor are biased for generating a second time-varying output voltage at the second output terminal in response to the time-varying current source; and
an output load biasing circuit coupled to the supply voltage and the first transistor for biasing the first transistor in response to a first biasing voltage provided by the output load biasing circuit based on a transmission impedance of the first transmission line.

12. The line driver of claim 11, wherein the first transistor is a NMOS transistor and the second transistor is a PMOS transistor.

13. The line driver of claim 11, wherein the first transistor is a PMOS transistor and the second transistor is a NMOS transistor.

14. The line driver of claim 11, wherein the output load biasing circuit includes a resistor having a resistance equivalent to the transmission impedance of the first transmission line.

15. The line driver of claim 14, wherein the output load biasing circuit includes means for generating the first biasing voltage as a function of the resistance of the resistor.

16. The line driver of claim 14, further comprising:
a current source biasing circuit coupled to the supply voltage and the time-varying current source for biasing the time-varying current source in response to a second biasing voltage provided by the current source biasing circuit based on a reference voltage.

17. The line driver of claim 16, wherein the output load biasing circuit includes means for generating the first biasing voltage as a function of the resistance of the resistor and the second biasing voltage.

18. The line driver of claim 11, further comprising:
a current source biasing circuit coupled to the supply voltage and the time-varying current source for biasing the time-varying current source in response to a second biasing voltage provided by the current source biasing circuit based on a reference voltage.

19. The line driver of claim 11, wherein the output load biasing circuit includes a third CMOS output load as a replica of the first CMOS output load.

20. The line driver of claim 11, wherein an output and impedance of the first CMOS output load is substantially insensitive to at least one of temperature variations of said line driver, process variations of said line driver, and power supply variations.

* * * * *